United States Patent [19]
Namizaki et al.

[11] 3,961,996
[45] June 8, 1976

[54] PROCESS OF PRODUCING SEMICONDUCTOR LASER DEVICE

[75] Inventors: Hirofumi Namizaki; Hirofumi Kan, both of Amagasaki, Japan

[73] Assignee: Mitsubishi Denki Kabushiki Kaisha, Japan

[22] Filed: Oct. 17, 1974

[21] Appl. No.: 515,616

[30] Foreign Application Priority Data
Oct. 23, 1973   Japan............................... 48-119221

[52] U.S. Cl................................... 148/171; 148/172; 148/175; 148/33.5; 331/94.5 H; 252/62.3 GA; 357/16; 357/18
[51] Int. Cl.²........................ H01L 7/36; H01L 7/38
[58] Field of Search........... 148/171, 175, 172, 173, 148/33.5; 331/94.5 H; 252/62.3 GA; 357/16, 18

[56] References Cited
UNITED STATES PATENTS

| | | | |
|---|---|---|---|
| 3,604,991 | 9/1971 | Yonezu et al................... | 148/171 X |
| 3,691,476 | 9/1972 | Hayashi.......................... | 148/171 X |
| 3,747,016 | 7/1973 | Kressel et al................... | 148/171 X |
| 3,758,875 | 9/1973 | Hayashi.......................... | 357/16 X |
| 3,824,493 | 7/1974 | Hakki............................. | 331/94.5 H |
| 3,849,790 | 11/1974 | Gottsmann et al........ | 331/94.5 H X |
| 3,855,607 | 12/1974 | Kressel et al................... | 357/18 |

OTHER PUBLICATIONS
Blum et al., "Double Heterojunction Laser Arrays," I.B.M. Technical Disclosure Bulletin, vol. 15, No. 7, Dec. 1972, p. 2345.

*Primary Examiner*—G. Ozaki
*Attorney, Agent, or Firm*—Robert E. Burns; Emmanuel J. Lobato; Bruce L. Adams

[57] ABSTRACT

N type $Ga_{0.7}Al_{0.3}As$, N type GaAs, N type $Ga_{0.7}Al_{0.3}As$ and P type $Ga_{1-0.3}Al_{0.3}As$ are epitaxially grown on an N type GaAs substrate in the named order one after another to form superposed layers. A selected portion of the uppermost layer is etched away along with those portions of the following two layers and one part of the lowermost layer located below the selected uppermost layer portion. P type $Ga_{1-0.3}Al_{0.3}As$ highly doped with zinc is epitaxially grown to fill the removed portions of the layers. Then the zinc is diffused into the adjacent portions of the layers to form a radiative recombination region of a layer on that portion of the GaAs layer converted to the P type.

6 Claims, 7 Drawing Figures

PROCESS OF PRODUCING SEMICONDUCTOR LASER DEVICE

BACKGROUND OF THE INVENTION

This invention relates to a process of producing a semiconductor laser device and more particularly to a process of producing a semiconductor laser device exhibiting in at least three directions the effect of confining carriers.

Semiconductor laser devices have greatly decreased in the density of threshold current due to their so-called double heterojunction structure. However the dimension of semiconductor elements involved has imposed a limitation on the threshold current and therefore conventional semiconductor laser devices have been able to be usually operated with a current in the order of several hundreds of milliamperes. There have been generally known double heterojunction lasers comprising the semiconductor layer formed of a semiconductive material, normally gallium arsenide (GaAs) of N or P type conductivity narrow in an energy gap or a forbidden band width and sandwiched between a pair of N and P type semiconductor layers formed of a semiconductive material broad in a forbidden band width, normally of gallium aluminum arsenide ($Ga_{1-x}Al_xAs$ where $x$ has a value less than unity and greater than zero). In double heterojunction lasers such as above described, light and carriers have been effectively confined in a direction perpendicular to the plane of the junction to permit light and carriers extremely high in density to be formed in the central GaAs layer. For this reason the threshold current of double heterojunction lasers have been reduced to be equal to or less than one tenth of that obtained by conventional homojunction lasers. However such double heterojunction lasers have exhibited no effect of confining light and carriers in the transverse direction of the junction.

SUMMARY OF THE INVENTION

Accordingly it is an object of the present invention to provide a new and improved process of producing a semiconductor laser device of the junction type further decreased in a threshold current as compared with the prior art practice while having the confining effect expanded in two dimensions.

The present invention accomplishes this object by the provision of a process of producing a semiconductor laser device, comprising the steps of successively forming on a first semiconductor layer of a first type conductivity, a second semiconductor layer of the first type conductivity and a third semiconductor layer of the first type conductivity, each of the first and third semiconductor layers being of a semiconductive material relatively broad in a forbidden band width, the second semiconductor layer being of a semiconductive material relatively narrow in a forbidden band width, selectively etching the third semiconductor layer from the exposed surface thereof to remove a region including the etched portion of the third semiconductor layer and that portion of said second semiconductor layer overlaid thereby and reaching said first semiconductor layer, forming a fourth semiconductor layer of a second type conductively so as to fill the removed region, the fourth semiconductor layer being of a semiconductive material relatively broad in a forbidden band width, converting those portions of the first, second and third semiconductor layers of the first type conductivity adjacent to the fourth semiconductor layer to the second type conductivity, disposing a first electrical connection in ohmic contact with the first semiconductor layer, and disposing a second electrical connection in ohmic contact with the fourth semiconductor layer.

Preferably the first, third and fourth semiconductor layers may be formed of gallium aluminum arsenide ($Ga_{1-x}Al_xAs$ where $x$ has a value less than unity and greater than zero), and the second semiconductor layer may be formed of gallium arsenide (GaAs). Advantageously, the third semiconductor layer may have disposed thereon a semiconductor layer of the second conductivity type and having a relatively broad forbidden band width. This additional semiconductor layer is then the uppermost layer and the selective etching begins with the exposed surface of the uppermost layer.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
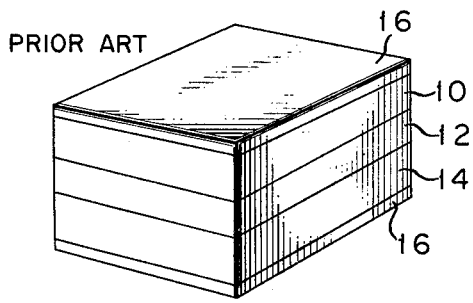
FIG. 1 is a perspective view of a double heterojunction laser constructed in accordance with the principles of the prior art.

Referring now to FIG. 1 of the drawings, there is illustrated a conventional semiconductor laser device comprising three semiconductor layers 10, 12 and 14 superposed on one another. The upper semiconductor layer 10 is usually of P type gallium aluminum arsenide ($Ga_{1-x}Al_xAs$) where $x$ has a value less than unity and greater than zero and has a forbidden band or an energy gap broad in width. The lower semiconductor layer 14 is also usually of N type gallium aluminum arsenide and has a forbidden band also broad in width. Those layers 10 and 14 have sandwiched therebetween the intermediate semiconductor layer 12 usually formed of N or P type gallium arsenide (GaAs) and having a forbidden band narrow in width to form a double heterojunction laser device. A pair of electrodes 16 are disposed in ohmic contact with the upper and lower semiconductor layers 10 and 14 respectively.

The arrangement as shown in FIG. 1 can confine light and carriers in a direction perpendicular to the plane of the p-n junction formed therein to provide light and carriers extremely high in density within the intermediate GaAs layer 12. Therefore a threshold current has been decreased to one tenth of that for conventional homojunction lasers or less. However the arrangement of FIG. 1 has not exhibited the effect of confining light and carriers in the transverse direction thereof.

The present invention contemplates to further decrease a density of threshold current and therefore an operating current for junction laser devices while exhibiting the effect of confining light and carriers in the longitudinal and transverse directions thereof or in two dimensions.

Figure 2:
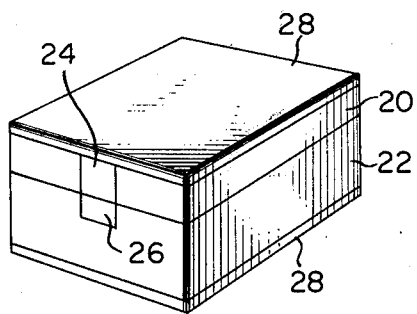
FIG. 2 is a perspective view of a junction laser useful in explaining the principles of the present invention.
Figure 4:
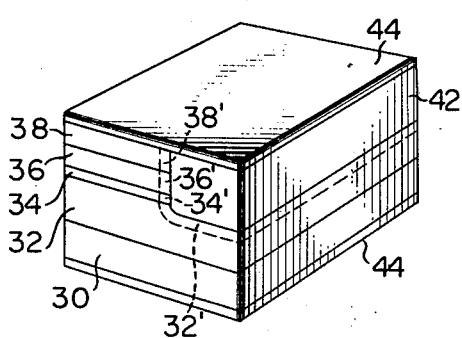
FIG. 4 is a perspective view of a semiconductor laser constructed in accordance with the method shown in FIG. 3.

The principles of the present invention will now be described with reference to FIG. 2. An arrangement as shown in FIG. 2 comprises a semiconductor layer 20 of a first type conductivity for example, an N type conductivity disposed upon a semiconductor layer 22 of a second or a P type conductivity to form a PN junction therebetween. In the example illustrated both layers 20 and 22 are formed of gallium aluminum arsenide ($Ga_{1-x}Al_xAs$ where $x$ has a value less than unity and greater than zero) and the p-n junction is a homojunction formed of gallium aluminum arsenide. The semiconductor layer 20 includes another semiconductor layer 24 formed of the first or N type conductivity gallium arsenide (GaAs) and contacted by a further semiconductor layer 26 formed in the semiconductor layer 22 of the second or P type conductivity gallium arsenide (GaAs). Thus a PN homojunction is formed between the semiconductor layers 24 and 26 of gallium arsenide. An electrode 28 is disposed in ohmic contact with both the layers 20 and 24 and another electrode 28 is disposed in ohmic contact with the layer 22.

When a forward voltage is applied across the arrangement of FIG. 2, a current $J_1$ flowing through the GaAs homojunction is greater than a current $J_2$ flowing through the $Ga_{1-x}Al_xAs$ homojunction because the GaAs is narrower in a forbidden band width than the $Ga_{1-x}Al_xAs$. For example, with $x$ equal to 0.3 in the $Ga_{1-x}Al_xAs$, a ratio between both currents ($J_1/J_2$) can readily be equal to about 100. This is experimentally confirmed for the so-called junction-stripe-geometry DH lasers operative following the similar principles to effect the concentration of a current. In other words, a great part of current flows through the GaAs homojunction formed between the layers 24 and 26.

The current flowing through this GaAs homojunction consists generally of a component resulting from electrons from the GaAs layer 24 of the first type conductivity injected into the GaAs layer 26 of the second type conductivity and a component resulting from holes from the layer 26 injected into the layer 24. However it is possible to compose the said current of the injected electrons alone by properly controlling impurity concentrations in both layers 24 and 26. The electrons from the layer 24 injected into the layer 26 are surrounded in three directions by the $Ga_{1-x}Al_xAs$ broader in the forbidden band width than the GaAs to be disabled to be diffused into the $Ga_{1-x}Al_xAs$ layer 22 of the second type conductivity. This results in the radiative recombination within the layer 26. That is, the effect of confining carriers is exhibited in two directions for conventional double heterojunction structures whereas the same effect is exhibited in three directions for laser devices such as shown in FIG. 2 according to the principles of the present invention.

Also the effect of confining light is similarly exhibited in three directions or in two dimensions because the layer 26 is surrounded in three directions by the $Ga_{1-x}Al_xAs$ layer 22 low in an index of refraction. It has been found that, by narrowing the width of the layer 26, an optical waveguide excellent in uniformity can be formed. Further the oscillation mode can be controlled.

It has been also found that the effect of most efficiently confining carriers and light is exhibited with the layer 26 having a dimension of from 1 micron to several microns in a direction perpendicular and a width of from about 0.3 to 1 micron in a direction parallel to the plane of the junction. As a result, the oscillation is possible with a low threshold current.

Figure 3A:
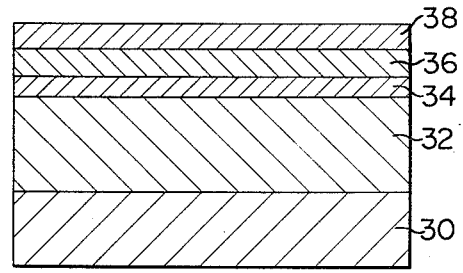
FIGS. 3a through 3d are sectional views illustrating the successive manufacturing steps of a method of producing a semiconductor laser in accordance with the principles of the present invention.

The present invention will now be described in conjunction with FIG. 3. As shown in FIG. 3a, a semiconductor substrate 30 of N type gallium arsenide (GaAs) has a first semiconductor layer 32 of N type gallium aluminum arsenide ($Ga_{1-x}Al_xAs$ where $x$ is above defined) grown in one of the opposite main faces by epitaxial growth-from-liquid-phase technique. Then a second semiconductor layer 34 of N type gallium arsenide (GaAs), a third semiconductor layer 36 of N type $Ga_{1-x}Al_xAs$ and a fourth semiconductor layer 38 of P type $Ga_{1-x}Al_xAs$ are successively grown on the semiconductor layer 32 in the named order one after another by utilizing epitaxial growth-from-liquid-phase technique. The gallium aluminum arsenide ($Ga_{1-x}Al_xAs$) used has included aluminum in an amount approximately corresponding to $x = 0.3$ in the formula $Ga_{1-x}Al_xAs$. Also the gallium arsenide and gallium aluminum arsenide have included their own impurities whose concentration is equal to $4 \times 10^{18}$ atoms per cubic centimeter.

Figure 3B:
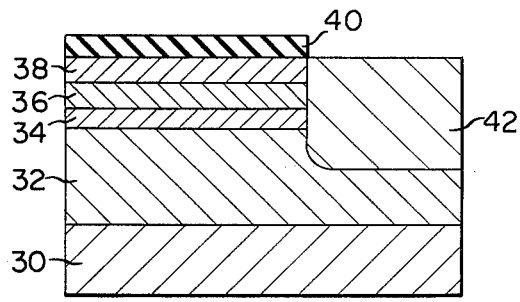

Then as shown in FIG. 3b, a silicon dioxide ($SiO_2$) film 40 is selectively disposed on the exposed surface of the P type semiconductor layer 38 and then that portion of the fourth semiconductor layer 38 not covered with the silicon dioxide film 40 is etched away as by an etchant of sulfuric acid system along with those portions of the semiconductor layers 36 and 34 located below that portion of the uppermost layer 38 to be etched away until that portion of the semiconductor layer 32 overlaid by the etched portion of the layer 34 is partly etched away. That region of the semiconductor layers etched away is designated by the reference numeral 42.

Any of the melts used in epitaxially growing the layers of 32 through 38 may be used to etch away the region 42. Subsequently p type gallium aluminum arsenide ($Ga_{1-x}Al_xAs$) including as an impurity, zinc with an impurity concentration of $1 \times 10^{19}$ atoms per cubic centimeter is epitaxially grown on the exposed surface of the semiconductor layer 32 until the now grown layer completely fills the removed region 42. In the example illustrated the gallium aluminum arsenide has included aluminum in an amount approximately corresponding to $x = 0.3$. The grown layer of P type $Ga_{1-x}Al_xAs$ is also designated by the reference 42. FIG. 3b shows the structure of the arrangement after the P type layer 42 has been grown.

Figure 3C:
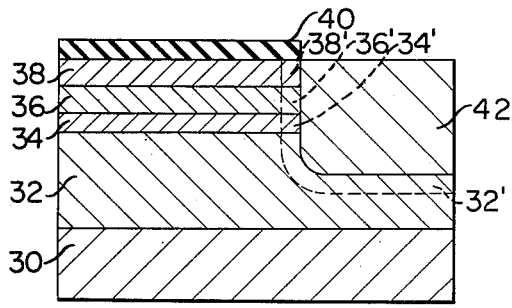
Figure 3D:
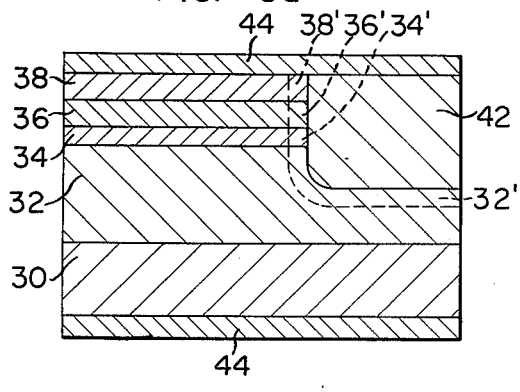

Subsequently the arrangement of FIG. 3b is thermally treated at a suitable temperature to diffuse the zinc within the layer 42 into the adjacent portions of the layers 32, 34, 36 and 38 to form respective diffusion zones 32', 34', 36' and 38' including a boundary shown at dotted line in FIG. 3c. The depth of diffusion can be controlled by the particular thermally treating temperature and time and has been of 1.5 microns in the example illustrated.

Among those diffusion zones, the zones 38' is only changed in the impurity concentration because it is originally of the P type conductivity and has the P type impurity diffused thereinto. The remaining zones 32' through 36' is converted to P type conductivity by means of the diffusion of the zinc thereinto because they are originally of the N type. The zones 32' through 38' in this case each have an impurity concentration of about $4 \times 10^{18}$ atoms per cubic centimeter. Therefore the radiative recombination region as above described in conjunction with FIG. 2 is formed at the zone 34'.

Thereafter the silicon dioxide film 40 is removed in the manner well known in the art and then a pair of electrodes 44 are disposed in ohmic contact with the other main face of the substrate 30 and the exposed surface of the layer and region 38 and 42 respectively.

While the present invention has been illustrated and described in conjunction with the GaAs - $Ga_{1-x}Al_xAs$ system it is to be understood that the same is not restricted to such substances and that it is generally applicable to combinations of two types of semiconductor material different in a forbidden band width from each other. Also the film 40 may be of silicon nitride ($Si_3N_4$) or $Si_xN_yO_z$. In order to etch away the region 42 (FIG. 3b), the etchant of sulfuric acid system may be replaced by an etchant containing boron and methanol or the like. The melt for etching away the region 42 is not restricted to any of the melts used in epitaxially growing the layers 32 through 38 and it may be any other desired melt. Further the layers 38 and 36 may be chemically etched away and then the layers 34 and one portion may be etched away with any desired melt. Alternatively, the melt used in growing the zinc doped gallium aluminum arsenide layer is used to etch away the layer 34 and one portion of the layer 32 and then grow P type gallium aluminum arsenide in the region 42.

What we claim is:

1. A process of producing a semiconductor laser device comprising the steps of forming, on a semiconductor substrate of a first type conductivity, a first semiconductor layer of the first type conductivity, a second semiconductor layer of the first type conductivity and a third semiconductor layer of the first type conductivity in the named order one after another, each of said semiconductor substrate and said second semiconductor layer being of a semiconductive material relatively narrow in a forbidden band width, each of said first semiconductor layer and said third semiconductor layer being of a semiconductor material relatively broad in a forbidden band, selectively etching said third semiconductor layer from the exposed surface thereof to remove a region including the etched portion of said third semiconductor layer and that portion of said second semiconductor layer located below the latter and reaching said first semiconductor layer, forming a fourth semiconductor layer of a second type conductivity so as to completely fill the removed region said fourth semiconductor layer being of a semiconductive material relatively broad in a forbidden band width, converting those portions of said first, second and third semiconductor layers adjacent to said fourth semiconductor layer to the second type semiconductivity, disposing a first electrical connection in ohmic contact with said semiconductor substrate, and disposing a second electrical connection in ohmic contact with said fourth semiconductor layer.

2. A process of producing a semiconductor laser device as claimed in claim 1 wherein said substrate and second layer are of N type gallium arsenide and said first and third layers are of N type gallium aluminum arsenide while said fourth layer is of P type gallium aluminum arsenide.

3. A process of producing a semiconductor laser device as claimed in claim 1 wherein said step of converting the conductivity includes a heat treatment.

4. A process of producing a semiconductor laser device, comprising the steps of forming, on a semiconductor substrate of a first type conductivity, a first semiconductor layer of the first type conductivity, a second semiconductor layer of the first type conductivity, a third semiconductor layer of the first type conductivity and a fourth semiconductor layer of a second type conductivity in the named order one after another, each of said substrate and said second layer being of a semiconductive material relatively narrow in a forbidden band width, each of said first, third and fourth layers being of a semiconductive material relatively broad in a forbidden band width, selectively etching said fourth semiconductor layer from the exposed surface thereof to remove a region including the etched portion of said fourth semiconductor layer and those portions of said third and second semiconductor layers located below the latter and reaching said first semiconductor layer, forming a fifth semiconductor layer of the second type conductivity so as to fill the removed region, said fifth semiconductor layer being of a semiconductive material relatively broad in a forbidden band width, converting those portions of said first, second and third semiconductor layers adjacent to said fifth semiconductor layer to the second type conductivity, disposing a first electrical connection in ohmic contact with said semiconductor substrate, and disposing a second electrical connection in ohmic contact with both said fourth semiconductor layer and said fifth semiconductor layer.

5. A process of producing a semiconductor laser device as claimed in claim 4 wherein each of said substrate and second layer is of N type gallium arsenide and each of said first and third layers is of N type gallium aluminum arsenide while each of said fourth and fifth layers is of P type gallium aluminum arsenide.

6. A process of producing a semiconductor laser device as claimed in claim 4 wherein said step of converting the conductivity includes a heat treatment.

* * * * *